United States Patent
White et al.

(10) Patent No.: US 11,624,113 B2
(45) Date of Patent: Apr. 11, 2023

(54) HEATING ZONE SEPARATION FOR REACTANT EVAPORATION SYSTEM

(71) Applicant: ASM IP HOLDING B.V., Almere (NL)

(72) Inventors: Carl Louis White, Gilbert, AZ (US); Eric James Shero, Phoenix, AZ (US); Kyle Fondurulia, Phoenix, AZ (US)

(73) Assignee: ASM IP HOLDING B.V., Almere (NL)

( * ) Notice: Subject to any disclaimer, the term of this patent is extended or adjusted under 35 U.S.C. 154(b) by 34 days.

(21) Appl. No.: 17/011,828

(22) Filed: Sep. 3, 2020

(65) Prior Publication Data
US 2021/0079527 A1   Mar. 18, 2021

Related U.S. Application Data

(60) Provisional application No. 62/900,282, filed on Sep. 13, 2019.

(51) Int. Cl.
*C23C 16/448* (2006.01)
*C23C 16/455* (2006.01)
(Continued)

(52) U.S. Cl.
CPC ...... *C23C 16/448* (2013.01); *C23C 16/45544* (2013.01); *C23C 16/45561* (2013.01);
(Continued)

(58) Field of Classification Search
CPC ............ C23C 16/448; C23C 16/45544; C23C 16/45561; C23C 16/4412; C23C 16/4481; C23C 16/4485; C23C 16/481; C23C 16/52

See application file for complete search history.

(56) References Cited

U.S. PATENT DOCUMENTS

| 3,587,620 A | 6/1971 | Berthold |
| 4,393,013 A | 7/1983 | McMenhmin |
(Continued)

FOREIGN PATENT DOCUMENTS

| CN | 102234790 | 11/2011 |
| CN | 104152870 | 11/2014 |
(Continued)

OTHER PUBLICATIONS

English Translation—JP 11168092, Mizutani, Jun. 1999 (Year: 1999).
(Continued)

*Primary Examiner* — Jeffrie R Lund
(74) *Attorney, Agent, or Firm* — Knobbe, Martens, Olson & Bear LLP

(57) ABSTRACT

Systems and methods related to temperature zone control systems can include a reactant source cabinet that is configured to be at least partially evacuated, a vessel base that is configured to hold solid source chemical reactant therein, and a lid that is coupled to a distal portion of the vessel base. The lid may include one or more lid valves. The system may further include a plurality of gas panel valves that are configured to deliver gas from a gas source to the vessel. The system may include a heating element that is configured to heat the one or more lid valves. The system may include a heat shield, a first portion of which is disposed between the one or more lid valves and the vessel base. A second portion of the heat shield may be disposed between the first heating element and the plurality of gas panel valves.

11 Claims, 9 Drawing Sheets

(51) Int. Cl.
    *C23C 16/48* (2006.01)
    *C23C 16/44* (2006.01)
    *C23C 16/52* (2006.01)

(52) U.S. Cl.
    CPC ...... *C23C 16/4412* (2013.01); *C23C 16/4481* (2013.01); *C23C 16/4485* (2013.01); *C23C 16/481* (2013.01); *C23C 16/52* (2013.01)

(56) References Cited

U.S. PATENT DOCUMENTS

| | | |
|---|---|---|
| 4,436,674 A | 3/1984 | McMenhmin |
| 4,560,462 A | 12/1985 | Radford |
| 4,722,298 A | 2/1988 | Rubin et al. |
| 4,883,362 A | 11/1989 | Gartner et al. |
| 4,947,790 A | 8/1990 | Gartner et al. |
| 5,071,553 A | 12/1991 | Newlin |
| 5,080,870 A | 1/1992 | Streetman et al. |
| 5,121,707 A | 6/1992 | Kanoo |
| 5,199,603 A | 4/1993 | Prescott |
| 5,377,429 A | 1/1995 | Sandhu |
| 5,380,367 A | 1/1995 | Bertone |
| 5,465,766 A | 11/1995 | Siegele et al. |
| 5,560,779 A | 10/1996 | Knowles et al. |
| 5,562,132 A | 10/1996 | Siegele et al. |
| 5,567,127 A | 10/1996 | Wentz |
| 5,667,682 A | 9/1997 | Laird |
| 5,709,753 A | 1/1998 | Olson |
| 5,732,744 A | 3/1998 | Barr et al. |
| 5,795,628 A | 8/1998 | Wisard |
| 5,803,165 A | 9/1998 | Shikazono |
| 5,836,483 A | 11/1998 | Disel |
| 5,876,503 A | 3/1999 | Roeder |
| 5,897,850 A | 4/1999 | Borsboom et al. |
| 5,904,771 A | 5/1999 | Tasaki et al. |
| 5,964,254 A | 10/1999 | Jackson |
| 6,083,321 A | 7/2000 | Lei et al. |
| 6,116,257 A | 9/2000 | Yokota |
| 6,216,708 B1 | 4/2001 | Agarwal |
| 6,221,306 B1 | 4/2001 | Johnson |
| 6,270,839 B1 | 8/2001 | Onoe et al. |
| 6,312,525 B1 | 11/2001 | Bright et al. |
| 6,365,229 B1 | 4/2002 | Robbins |
| 6,422,830 B1 | 7/2002 | Yamada |
| 6,444,043 B1 | 9/2002 | Gegenwart |
| 6,718,126 B2 | 4/2004 | Lei |
| 6,849,832 B2 | 2/2005 | Endo |
| 6,889,864 B2 | 5/2005 | Lindfors et al. |
| 6,905,541 B2 | 6/2005 | Chen et al. |
| 6,909,839 B2 | 6/2005 | Wang et al. |
| 6,946,034 B1 | 9/2005 | Bruce |
| 7,018,478 B2 | 3/2006 | Lindfors et al. |
| 7,156,380 B2 | 1/2007 | Soininen |
| 7,186,385 B2 | 3/2007 | Ganguli et al. |
| 7,270,709 B2 | 9/2007 | Chen et al. |
| 7,278,887 B1 | 10/2007 | Palinkas |
| 7,413,767 B2 | 8/2008 | Bauch |
| 7,437,060 B2 | 10/2008 | Wang et al. |
| 7,497,420 B2 | 3/2009 | Soininen |
| 7,531,090 B1 | 5/2009 | Stamey |
| 7,730,747 B2 | 6/2010 | Galante |
| 7,763,115 B2 | 7/2010 | Hatanaka et al. |
| 7,815,737 B2 | 10/2010 | Kim |
| 7,833,353 B2 | 11/2010 | Furukawahara et al. |
| 7,926,440 B1 * | 4/2011 | Tombier, Jr. ............ C23C 16/52 |
| | | 423/447.3 |
| 7,971,861 B2 | 7/2011 | Soininen |
| 8,137,462 B2 | 3/2012 | Fondurulia et al. |
| 8,357,241 B2 | 1/2013 | Matsumoto |
| 8,986,456 B2 | 3/2015 | Fondurulia |
| 9,593,416 B2 | 3/2017 | Fondurulia et al. |
| 10,876,205 B2 | 12/2020 | Verghese et al. |
| 11,377,732 B2 | 7/2022 | Verghese et al. |
| 2001/0003603 A1 | 6/2001 | Eguchi et al. |
| 2002/0108670 A1 | 8/2002 | Baker et al. |
| 2002/0134760 A1 | 9/2002 | Rehrig |
| 2003/0054100 A1 | 3/2003 | Eser |
| 2004/0000270 A1 | 1/2004 | Carpenter |
| 2004/0013577 A1 | 1/2004 | Ganguli |
| 2004/0016404 A1 | 1/2004 | Gregg et al. |
| 2004/0159005 A1 | 8/2004 | Olander |
| 2005/0000428 A1 | 1/2005 | Shero et al. |
| 2005/0006799 A1 | 1/2005 | Gregg |
| 2005/0019026 A1 | 1/2005 | Wang et al. |
| 2005/0019028 A1 | 1/2005 | Wang et al. |
| 2005/0039794 A1 | 2/2005 | Birtcher |
| 2005/0066893 A1 | 3/2005 | Soinenen |
| 2005/0072357 A1 | 4/2005 | Shero et al. |
| 2005/0167981 A1 | 8/2005 | Nuttall |
| 2005/0211172 A1 | 9/2005 | Freeman |
| 2005/0263075 A1 | 12/2005 | Wang et al. |
| 2006/0112882 A1 | 6/2006 | Suzuki |
| 2006/0112883 A1 | 6/2006 | Suzuki |
| 2006/0115593 A1 | 6/2006 | Suzuki |
| 2006/0133955 A1 | 6/2006 | Peters |
| 2006/0185597 A1 | 8/2006 | Suzuki |
| 2006/0185598 A1 | 8/2006 | Suzuki |
| 2006/0213437 A1 * | 9/2006 | Ishizaka ............ C23C 16/4412 |
| | | 118/715 |
| 2007/0101940 A1 | 5/2007 | Iizuka |
| 2007/0235085 A1 | 10/2007 | Nakashima |
| 2008/0047890 A1 | 2/2008 | Klein |
| 2008/0085226 A1 | 4/2008 | Fondurulia et al. |
| 2008/0149031 A1 | 6/2008 | Chu et al. |
| 2009/0087545 A1 | 4/2009 | Ohmi |
| 2009/0107401 A1 | 4/2009 | Reinhold et al. |
| 2009/0114157 A1 | 5/2009 | Lee |
| 2009/0133632 A1 | 5/2009 | Soininen |
| 2009/0136668 A1 | 5/2009 | Gregg et al. |
| 2010/0065481 A1 | 3/2010 | Formica |
| 2010/0081104 A1 | 4/2010 | Hein et al. |
| 2010/0242835 A1 | 9/2010 | Arena |
| 2010/0255198 A1 | 10/2010 | Cleary |
| 2010/0322604 A1 | 12/2010 | Fondurulia et al. |
| 2011/0033618 A1 | 2/2011 | Noll et al. |
| 2011/0146579 A1 | 6/2011 | Seo et al. |
| 2011/0226624 A1 | 9/2011 | Dorrer |
| 2012/0034378 A1 | 2/2012 | Woelk et al. |
| 2012/0156108 A1 | 6/2012 | Fondurulia et al. |
| 2014/0174955 A1 | 6/2014 | Sasagawa |
| 2014/0329025 A1 | 11/2014 | Cleary |
| 2015/0145154 A1 | 5/2015 | Chandrasekharan et al. |
| 2015/0170909 A1 | 6/2015 | Sato |
| 2017/0135383 A1 * | 5/2017 | Liss ...................... A47J 27/002 |
| 2017/0250625 A1 | 8/2017 | Fan et al. |
| 2017/0306486 A1 | 10/2017 | Quinn et al. |
| 2018/0094350 A1 | 4/2018 | Verghese et al. |
| 2018/0094351 A1 | 4/2018 | Verghese et al. |
| 2019/0139807 A1 * | 5/2019 | White ................ C23C 16/4412 |
| 2020/0056283 A1 | 2/2020 | Shero et al. |
| 2021/0040613 A1 | 2/2021 | White et al. |
| 2021/0079527 A1 * | 3/2021 | White ................ C23C 16/4481 |

FOREIGN PATENT DOCUMENTS

| | | |
|---|---|---|
| CN | 104746040 | 7/2015 |
| GB | 2 151 662 | 7/1985 |
| JP | S64-064314 | 3/1989 |
| JP | H01-265511 | 10/1989 |
| JP | H09-040489 | 2/1997 |
| JP | H11-168092 | 6/1999 |
| KR | 2011-0117021 | 10/2011 |
| KR | 2014-0133641 | 11/2014 |
| WO | WO 2004/106584 | 12/2004 |
| WO | WO 2007/057631 | 5/2007 |

OTHER PUBLICATIONS

Final Office Action dated Oct. 18, 2011 in U.S. Appl. No. 11/870,374.
Final Office Action dated Nov. 23, 2011 in U.S. Appl. No. 11/870,374.
Final Office Action dated Sep. 10, 2015 in U.S. Appl. No. 13/404,700.
Final Office Action dated Oct. 5, 2016 in U.S. Appl. No. 13/404,700.

(56) References Cited

OTHER PUBLICATIONS

Notice of Reasons for Rejection dated Mar. 27, 2012 for Japanese Patent Application No. 2009-532567, filed Oct. 10, 2007.
Office Action dated Jun. 23, 2011 in U.S. Appl. No. 11/870,374.
Office Action dated Sep. 27, 2013 in Korean Application No. 10-2009-7009467.
Office Action dated Jan. 21, 2015 in U.S. Appl. No. 13/404,700.
Office Action dated May 16, 2016 in U.S. Appl. No. 13/404,700.
Office Action dated Dec. 6, 2018 in U.S. Appl. No. 15/283,120.
Office Action dated Mar. 22, 2019 in U.S. Appl. No. 15/283,120.
Partial International Search Report on claims 1-9 from the International Searching Authority dated Apr. 15, 2008, in corresponding International Patent Application No. PCT/US2007/081005.

* cited by examiner

HEATING ZONE SEPARATION FOR REACTANT EVAPORATION SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

A typical solid or liquid source reactant delivery system is disposed within a system that includes one or more heating elements and/or cooling elements. The vessel can include a chemical reactant that is to be vaporized. A carrier gas carries reactant vapor along with it through a vessel outlet and ultimately to a reaction chamber.

FIELD

The present application relates generally to systems and methods involving semiconductor processing equipment, and specifically to vaporizing systems for chemical vapor delivery.

SUMMARY

Some embodiments of a temperature zone control system can include a reactant source cabinet that is configured to be at least partially evacuated. The system can include a vessel base that is configured to hold solid source chemical reactant therein. The vessel base may also be configured to be disposed within the reactant source cabinet. The system may include a lid that is coupled to a distal portion of the vessel base, and the lid may include one or more lid valves. The system can include a plurality of gas panel valves that are configured to deliver gas from a gas source to the vessel. The system can include a first heating element (such as a heater) that is configured to heat the one or more lid valves. The system can include a heat shield that includes a first portion and a second portion. The first portion may be disposed between the one or more lid valves and the vessel base. The second portion may be disposed between the first heating element and the plurality of gas panel valves. The heat shield may be configured to impede a transfer of heat from the lid valve to the vessel base by, for example, preventing, inhibiting, or reducing (relative to a comparable system without a heat shield) the transfer of heat from the lid to the vessel base.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

BRIEF DESCRIPTION OF THE DRAWINGS

These and other aspects of the disclosure will be readily apparent to the skilled artisan in view of the description below, the appended claims, and from the drawings, which are intended to illustrate and not to limit the invention, and wherein:

DETAILED DESCRIPTION

Figure 1:
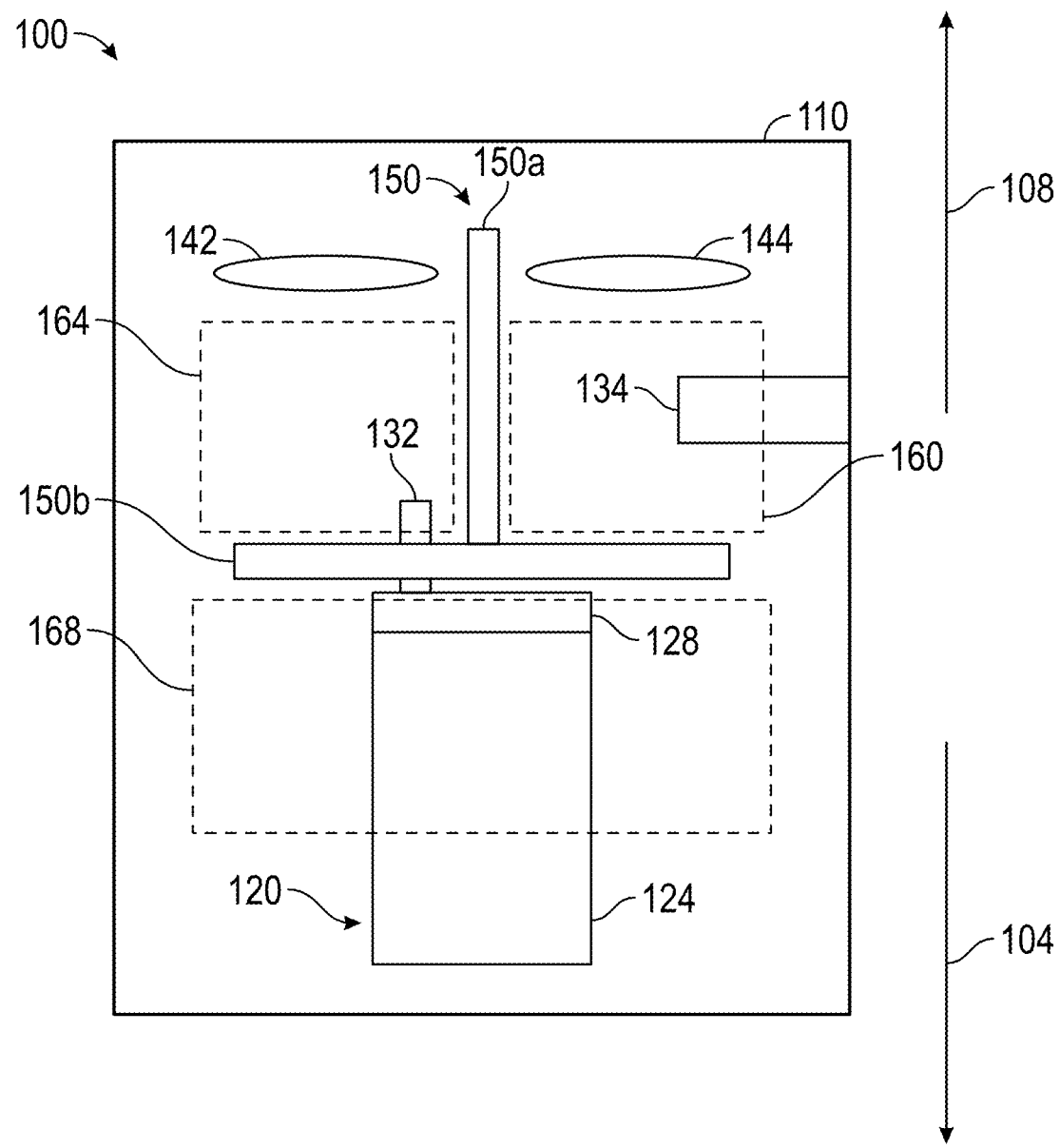
FIG. 1 shows an example temperature zone control system, according to some configurations.

The headings provided herein, if any, are for convenience only and do not necessarily affect the scope or meaning of the claimed invention. Described herein are systems and related methodologies for delivering vaporized or sublimed reactant in a high capacity deposition module.

The following detailed description details certain specific embodiments to assist in understanding the claims. However, one may practice the inventive subject matter in a multitude of different embodiments and methods, as defined and covered by the claims.

A chemical reactant or solid source delivery system can include a solid or liquid source vessel and a heater (e.g., a radiant heat lamp, resistive heater, and/or the like). The vessel includes the source precursor (which may also be referred to as "chemical precursor"), which can be a solid (e.g., in powder form) or liquid. The heater heats the vessel to facilitate the vaporization and/or sublimation of the precursor into the chemical reactant in the vessel. The vessel can have an inlet and an outlet for the flow of a carrier gas (e.g., nitrogen) through the vessel. By way of example, the inlet and/or the outlet may comprise a valve (such a valve may be referred to herein as a "lid valve"). The carrier gas may be inert, for example nitrogen, argon, or helium). Generally, the carrier gas conveys reactant vapor (e.g., evaporated or sublimated chemical reactant) along with it through the vessel outlet and ultimately to a reaction chamber. The reaction chamber may be for deposition on a substrate. The vessel typically includes isolation valves for fluidly isolating the contents of the vessel from the vessel exterior. One isolation valve may be disposed upstream of the vessel inlet, and another isolation valve may be disposed downstream of the vessel outlet. The source vessel of some embodiments comprises, consists essentially of, or consists of a sublimator. As such, wherever a "source vessel" is mentioned herein, a sublimator (such as a "solid source chemical sublimator") is also expressly contemplated.

Chemical vapor deposition (CVD) is a known process in the semiconductor industry for forming thin films of materials on substrates such as silicon wafers. In CVD, reactant vapors (including "precursor gases") of different reactant chemicals are delivered to one or more substrates in a reaction chamber. In many cases, the reaction chamber includes only a single substrate supported on a substrate holder (such as a susceptor), with the substrate and substrate holder being maintained at a desired process temperature. In typical CVD processes, mutually reactive reactant vapors react with one another to form thin films on the substrate, with the growth rate being related to the temperature and the amounts of reactant gases. In some variants, energy to drive the deposition reactions is supplied in whole or in part by plasma.

In some applications, the reactant gases are stored in gaseous form in a reactant source vessel. In such applications, the reactants are often gaseous at standard pressures and temperatures of around 1 atmosphere and room temperature. Examples of such gases include nitrogen, oxygen, hydrogen, and ammonia. However, in some cases, the vapors of source chemicals ("precursors") that are liquid or solid (e.g., hafnium chloride, hafnium oxide, zirconium dioxide, etc.) at standard pressure and temperature are used. For some solid substances (referred to herein as "solid source precursors", "solid chemical reactants", or "solid reactants"), the vapor pressure at room temperature is so low that they are typically heated and/or maintained at very low pressures to produce a sufficient amount of reactant vapor for the reaction process. Once vaporized (e.g., sublimed or evaporated), keeping the vapor phase reactant at or above the vaporizing temperature through the processing can prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described herein. ALD is a type of vapor deposition wherein a film is built up through self-saturating reactions performed in cycles. The thickness of the film is determined by the number of cycles performed. In an ALD process, gaseous reactants are supplied, alternatingly and/or repeatedly, to the substrate or wafer to form a thin film of material on the wafer. One reactant adsorbs in a self-limiting process on the wafer. A different, subsequently pulsed reactant reacts with the adsorbed material to form no more than a single molecular layer of the desired material. Decomposition may occur through mutual reaction between the adsorbed species and with an appropriately selected reagent, such as in a ligand exchange or a gettering reaction. In some ALD reactions, no more than a molecular monolayer forms per cycle. Thicker films are produced through repeated growth cycles until the target thickness is achieved.

In some ALD reactions, mutually reactive reactants are kept separate in the vapor phase with intervening removal processes between substrate exposures to different reactants. For example, in time-divided ALD processes, reactants are provided in pulses to a stationary substrate, typically separated by purging or pump down phases; in space-divided ALD processes, a substrate is moved through zones with different reactants; and in some processes aspects of both space-divided and time-divided ALD can be combined. The skilled artisan will appreciate that some variants or hybrid processes allow some amount of CVD-like reactions, either through selection of the deposition conditions outside the normal ALD parameter windows and/or through allowing some amount of overlap between mutually reactive reactants during exposure to the substrate.

Reactant source vessels are normally supplied with gas lines extending from the vessel inlet and vessel outlet, isolation valves on the lines, and fittings on the valves, the fittings being configured to connect to the gas flow lines of the remaining substrate processing apparatus. It is often desirable to provide one or more additional heaters for heating the various valves and gas flow lines between the reactant source vessel and the reaction chamber, to prevent the reactant vapor from condensing and depositing on such components. Accordingly, the gas-conveying components between the source vessel and the reaction chamber may be referred to as "hot" since the temperature is generally maintained above the vaporization/condensation/sublimation temperature of the reactant.

Various vessels may be included for filling the reactant source vessels with source precursor as described herein. Conventionally, source vessels are removed from a reactor system for refilling, though vessels that are refilled while disposed in the reactor system are also suitable for embodiments herein. A cabinet in a reactor system can contain one or more vessels, for example in vacuum conditions. Furthermore, vessels in accordance with some embodiments herein can be disposed near, adjacent, or within a reactor system. Having the vessel in proximity to the reactor system can reduce the need for long pipes, reduce the chance of condensation inside piping, and or reduce a need for unnecessary fluidic elements. Additional features are described herein with reference to various configurations.

Because various heating and/or cooling elements may be included in the chemical reactant or solid source delivery system of some embodiments, separating the system into two or more thermal zones can be advantageous in controlling which elements in which zone(s) get additional heating or cooling. If isolation is not maintained between thermal zones, there can be a risk of thermal cross-talk between heating and/or cooling elements, which may result in poor or imprecise temperature control. Moreover, if there is insufficient control of thermal communication (e.g., radiation) between or among the thermal zones, some system components may become heated and/or cooled more or less than desired, which can lead to undesired decomposition or condensation of reactant, damaging the system. Downstream components (e.g. gas lines, valves, filters, etc.) may be controlled to a higher temperature in order to prevent condensation of the sublimed chemical, as described above. The heating system must also not overheat the sublimed chemical such that decomposition can occur.

Precisely and accurately controlling multiple heating and/or cooling sources is generally difficult due to thermal cross-talk between or among various reactor and/or vessel components that may, for example, be in different radiation zones. This can result in competing control of each zone. Additionally, temperature sensors, such as thermocouples, that are intended to monitor and/or control the temperature in one thermal zone may be influenced by heat radiating from another thermal zone. Without precise temperature control of the various components in, for example, a solid precursor delivery system, hot and cold spots may exist in the vapor delivery system, which may result in condensation (e.g., within valves, pipes, filters, etc.) and/or decomposition of reactant.

By disposing one or more heat shields in the system, thermal radiation can be directed toward desired components while simultaneously isolating other components in different thermal zone. Accordingly, superior temperature control can be achieved. The heat shield can take a variety of forms, for example reflective panels that are disposed between thermal zones, such as reflective panels described herein in more detail. The reflective panels may include sheet metal (e.g., stainless steel) that is adapted to reflect radiative heat from one or more heating elements.

Generally, chemical precursor may be contained (e.g., stored) within a vessel in a solid state and may be sublimed or vaporized to be passed to another location (e.g., a deposition module or a reaction chamber). In some configurations, carrier gas may be used to carry the evaporated chemical precursor from the vessel to another location (e.g., to a deposition module or to a reaction chamber). Thus, a base of the vessel may preferably be at a relatively low temperature (e.g., to maintain the precursor as a solid) and a lid of the vessel may preferably be at a relatively high temperature (e.g., to facilitate the precursor entering the vapor phase to allow it flow to another location such as a deposition module or reaction chamber, while minimizing or preventing condensation in the valves and downstream flow path).

FIG. 1 shows an example temperature zone control system 100, according to some configurations. The temperature zone control system 100 can include a reactant source cabinet 110, a reactant source vessel 120, and a heat shield 150. Within the reactant source cabinet 110, the temperature zone control system 100 can include a first heating element (such as a heater) 142 and a second heating element (such as a heater) 144. The first heating element 142 can be configured to communicate heat to one or more lid valves 132. The second heating element 144 may be configured to heat one or more gas panel valves 134. The temperature zone control system 100 can include one or more additional elements as described herein. The heat shield 150 can include a first portion 150a and a second portion 150b. The second portion 150b may impede (e.g., inhibit, prevent, or reduce relative to a comparable system without the heat shield 150) the transfer of heat from the lid valves 132 to the vessel base 124. The temperature zone control system 100 may include a reactor system (not shown).

The reactant source cabinet 110 can define a cabinet axis that extends in a proximal direction 104 and in a distal direction 108. The reactant source vessel 120 may be disposed proximal to at least a portion of the heat shield 150. At least one of the first heating element 142 and/or the second heating element 144 may be disposed distal of the reactant source vessel 120. The first portion 150a may be disposed approximately parallel to the cabinet axis. The second portion 150b may be disposed transverse with (e.g., at a right angle to) the first portion 150a. The first portion 150a and/or the second portion 150b may comprise a corresponding plate, though other structures (e.g., block, curtain, net, etc.) may be used.

The heat shield 150 can be configured to create two or more thermal zones. As shown in FIG. 1, the temperature zone control system 100 can include a first thermal zone 160, a second thermal zone 164, and a third thermal zone 168. The first thermal zone 160 and/or the second thermal zone 164 may be disposed distal of the second portion 150b and/or the third thermal zone 168. The first thermal zone 160 may be disposed laterally opposite the second thermal zone 164 across the first portion 150a. The second portion 150b of the heat shield 150 may include a gap adapted to allow one or more lid valves 132 to pass therethrough. Thus, in some configurations, a distal portion of the one or more lid valves 132 may be disposed at least partially in the second thermal zone 164. The gas panel valves 134 may be coupled to an inner surface of the reactant source cabinet 110. As shown, the gas panel valves 134 may be disposed at least partially within the first thermal zone 160. Thus, in some examples, portions of the lid valves 132 and the gas panel valves 134 may be disposed in separate thermal zones. The gas panel valves 134 may be disposed downstream of the outlet (and any lid valve 132 regulating gas flow through the outlet) and upstream of a reaction chamber. The gas panel valves 134 may control reactant flow to the reaction chamber.

The reactant source vessel 120 can include a vessel base 124 and a vessel lid 128 coupled thereto. The vessel lid 128 may include the one or more lid valves 132, for example an inlet valve and/or outlet valve. The vessel lid 128 and/or the vessel base 124 may be disposed proximal to the second portion 150b of the heat shield 150. Thus, in some examples, at least a portion of the reactant source vessel 120 (e.g., the vessel base 124, the vessel lid 128) is disposed within the third thermal zone 168. Accordingly, portions of the lid valves 132, the gas panel valves 134, and the reactant source vessel 120 may be disposed in different thermal zones.

The reactant source vessel 120 can contain a chemical reactant, example a solid or liquid source precursor. A "solid source precursor" has its customary and ordinary meaning in the art in view of this disclosure. It refers to a source chemical that is solid under standard conditions (e.g., room temperature and atmospheric pressure). The reactant source vessel 120 may define a vessel axis that extends in the proximal direction 104 and the distal direction 108 (e.g., may be parallel to the cabinet axis). The vessel axis may be oriented in an "up" and "down" orientation with reference to FIG. 1. As shown, the vessel base 124 is disposed proximal to the vessel lid 128. FIG. 1 should not be viewed as limiting the number of elements the reactant source vessel 120 can contain, as described herein. In some embodiments, the vessel lid 128 is adapted to be mechanically attached to the vessel base 124. This may be done using one or more of attachment devices (e.g., bolts, screws, etc.). In certain embodiments, the vessel lid 128 and the vessel base 124 are mechanically attached in a gas-tight fashion. In some embodiments, the vessel lid 128 is detachably immobilized on the vessel base 124. The reactant source cabinet 110 as described herein may be configured to maintain its contents in vacuum conditions. It is contemplated that disposing a reactant source vessel 120 in a vacuum in accordance with some embodiments can facilitate maintaining as temperature gradient in the reactant source vessel 120, for example so that heat is primarily conducted along the vessel axis from a distal 108 to a proximal 104 portion.

The reactant source vessel 120 can include one or more cooling elements (not shown) and/or heating elements (e.g., heaters such as heating rods, heating filaments, heating plates, etc.), such as the first heating element 142 and the second heating element 144. A cooling element (e.g., a water cooler or cooling plate) may be disposed at or near a proximal portion of the vessel base 124. As shown, one or more heating elements 142, 144 (e.g., heating rods, heating filaments, heating plates, etc.) may be disposed at or near a distal portion of the vessel lid 128. The use of heating and/or cooling elements can provide more precise control of temperature gradients and/or temperatures. In some examples, the cooling element(s) is/are disposed proximal of the vessel base 124. The one or more cooling elements may be disposed adjacent (e.g., in contact with) the vessel base 124. Accordingly, the one or more cooling elements may preferentially cool the vessel base 124 relative to the vessel lid 128, thus forming a temperature gradient from the proximal portion of the vessel 120 to the distal portion of the vessel. Additionally or alternatively, the one or more heating elements may be disposed distal of the vessel lid 128. The cooling elements may include or consist of fluid cooled elements (e.g., water cooled, air cooled, etc.). The heating elements may include or consists of a heater. The one or more heating elements 142, 144 may be configured to heat respective elements of the temperature zone control system 100, such as the one or more lid valves 132 of the vessel lid 128 (which may be heated, e.g., by the second heating element 144) and/or one or more gas panel valves 134 (which may be heated, e.g., by the second heating element 144) via radiation. In some examples, a heating element may heat the vessel lid 128 and/or the one or more lid valves 132, the gas panel valves 134, and/or other elements of the temperature zone control system 100 via conduction.

The ratio of the height of the vessel base 124 to the vessel lid 128 can be such that the temperature gradient is formed advantageously within or between the one or more lid valves 132 of the vessel lid 128, for example to keep these valves at a sufficiently high temperature (e.g., at or above the second threshold temperature) so as to minimize or prevent condensation in the lid valves 132 of the vessel lid 128, while the vessel base 124 remains as a sufficiently low temperature to contain liquid or solid source precursor therein. The ratio of a height of the vessel base 124 to a height of the vessel lid 128 can be greater than about 1, greater than about 1.5, greater than about 2, greater than about 3, greater than about 4, greater than about 5, greater than about 6, greater than about 8, greater than about 10, greater than about 12, greater than about 15, greater than any value therebetween, or fall within any range having endpoints therein, for example, 1-2, 1-5, 1-10, 1-15, 2-5, 2-10, 2-15, 5-10, 5-15, or 10-15. The vessel base 124 and/or the vessel lid 128 can include a ceramic, a metal, or other structural material.

It may be advantageous to minimize the volume or footprint that the reactant source vessel 120 would entail, for example so that it may be disposed within the temperature zone control system 100. Compact vessel assemblies can reduce such a footprint. In certain embodiments, each reactant source vessel 120 can have an area (e.g., on which the reactant source vessel 120 is placed) of between about 40 $cm^2$ and 150 $cm^2$.

The vessel lid 128 can include one or more inlets and/or outlets (not shown). The inlets and/or outlets can each include a corresponding lid valve 132. The vessel lid 128 can include one or more inlets such as a chemical inlet and/or a carrier gas inlet, and an outlet. The chemical inlet can be configured to receive source precursor therethrough. The source precursor may be in a solid, liquid, sublimed or evaporated form (e.g., coupled with a carrier gas) as it enters the reactant source vessel 120 (e.g., from a larger bulk fill vessel). The carrier gas outlet may be configured to receive carrier gas into the vessel. Carrier gas and vapor phase reactant may exit the vessel through the outlet. In some embodiments, the chemical inlet and carrier gas inlet are the same inlet.

The carrier gas inlet can allow flow of a carrier gas therethrough. The carrier gas inlet can include a corresponding valve coupled to the carrier gas inlet of the reactant source vessel 120. The valve can be configured to regulate the flow of gas through the carrier gas inlet. The carrier gas can couple with sublimed or evaporated chemical within the reactant source vessel 120. The effluent from the reactant source vessel 120 then includes the carrier gas and the reactant gas vaporized from within the interior of the reactant source vessel 120. In some embodiments, an interior of the reactant source vessel 120 is configured to contain a headspace after it is filled with chemical reactant. The headspace can be in fluid communication with the chemical inlet, the carrier gas inlet, and/or the chemical outlet, and can be configured for sublimation of the chemical reactant by the fluid (e.g., carrier gas) in the headspace. Accordingly, the headspace can provide a failsafe so that the chemical reactant can continue to be sublimed or evaporated even if one or more of the inlets/outlets is clogged.

Inactive or inert gas is preferably used as the carrier gas for the vaporized precursor. The carrier gas (e.g., nitrogen, argon, helium, etc.) may be fed into the reactant source vessel 120 through the carrier gas inlet. In some embodiments, different inert gases may be used for various processes and in various systems described herein. It will be appreciated that additional valves and/or other fluidic control elements may be included that are not shown.

The effluent (e.g., carrier gas plus evaporated chemical) can pass through the outlet. The outlet can be in communication with a reaction chamber or deposition module and/or another fill vessel. In some configurations, the outlet is configured to pass the evaporated chemical (e.g., with the carrier gas) to the reaction chamber or deposition module, for example, in preparation for a downstream chemical reaction. One or more of the chemical inlet, the carrier gas inlet, and the chemical outlet can include a corresponding valve (e.g., of the lid valves 132) configured to control a flow of gas therethrough. Additional information about example solid source chemical sublimators and/or fluidics thereof may be found in U.S. Pat. No. 8,137,462, issued on Mar. 20, 2012 and titled "PRECURSOR DELIVERY SYSTEM," which is hereby incorporated by reference herein in its entirety for all purposes. It will be appreciated that additional valves and/or other fluidic elements may be included that are not shown. Additional valves and other fluidic elements may be included that are not shown in certain configurations.

In certain configurations, the vessel base 124 is adapted to hold solid source precursor. The vessel base 124 may comprise a substantially planar surface for holding the source precursor, but other shapes and variants are possible. The reactant source vessel 120 can define an interior, such as the space delineated by the interior of the walls and ceiling of the reactant source vessel 120 and a floor of the vessel base 124. In some embodiments, the interior is configured to contain chemical reactant such as solid source chemical. The reactant source vessel 120 or portions thereof may be arranged in a variety of ways. For example, the reactant source vessel 120 may include a single section, or may include two or more lateral sections (such as trays containing source precursor) that are stacked and/or attached to one another.

In some embodiments, a height of the assembly of the reactant source vessel 120 can be in the range of about 25 cm-120 cm. In some embodiments, the height can be in the range of about 50 cm-100 cm, and may be for example about 60 cm (about 24 inches) in some embodiments. In some embodiments, the width (e.g., diameter) of the reactant source vessel 120 can be in the range of about 20 cm-50 cm. In some embodiments, the width of the reactant source vessel 120 can be in the range of about 30 cm-40 cm, and may be for example about 38 cm (about 15 inches) in certain embodiments. In some embodiments, the reactant source vessel 120 can have a height: diameter aspect ratio in the range of about 1-4. In some embodiments, the vessel occupies a shape approximating a cylinder, but other shapes are possible. As such, in some embodiments, the reactant source vessel 120 comprises, consists essentially of, or consists of a cylindrical shape. In some embodiments, the mass of the reactant source vessel 120 (unfilled) in various embodiments described herein can range from about 10 kg-50 kg. In some embodiments, the mass of the filled reactant source vessel 120 can be in the range of about 35 kg-85 kg. Lower masses of vessels can allow for easier transportation, but higher masses can facilitate higher volume reactant, necessitate fewer refills, and allow for longer fills for sublimators.

The heat shield 150 can be configured to maintain a temperature gradient between the vessel base 124 and a distal portion of the one or more lid valves 132, so that the vessel base 124 can be maintained at or below a first threshold temperature, while the distal portion of the one or more lid valves 132 can be maintained at or above a second threshold temperature that is greater than the first threshold temperature. For example, the vessel base 124 and the distal portion of the one or more lid valves 132 may be maintained at a difference in temperature (e.g., a different between the second threshold temperature and the first threshold temperature). For example, the difference in temperature between the base and the lid can be at least about 1° C., about 2° C., about 3° C., about 4° C., about 5° C., about 6° C., about 7° C., about 8° C., about 9° C., about 10° C., about 11° C., about 12° C., about 13° C., about 14° C., about 15° C., about 18° C., about 20° C., about 25° C., about 30° C., any value therebetween, or fall within any range having endpoints therein, for example about 1° C. to about 5° C., about 1° C. to about 10° C., about 1° C. to about 15° C., about 1° C. to about 20° C., about 1° C. to about 25° C., about 5° C. to about 10° C., about 5° C. to about 15° C., about 5° C. to about 20° C., about 5° C. to about 25° C., about 10° C. to about 15° C., about 10° C. to about 20° C., or about 10° C. to about 25° C. The gradient can be disposed across a distance (e.g., axial distance) of about 1 inch, about 2 inches, about 3 inches, about 6 inches, about 9 inches, about 12 inches, about 15 inches, about 18 inches, about 21 inches, about 24 inches, about 27 inches, about 30 inches, about 33 inches, about 36 inches, any value therebetween, or fall within any range having endpoints therein, for example about 3 to about 9 inches, about 3 to about 12 inches, about 3 to about 24 inches, about 3 to about 36 inches, about 9 to about 12 inches, about 9 to about 24 inches, about 9 to about 36 inches, about 12 to about 24 inches, about 12 to about 36 inches, or about 24 to about 36 inches.

The heat shield 150 can include a variety of shapes. The heat shield 150 may form a "T" shape in some configurations, such as is shown in FIG. 1. In other configurations, the heat shield 150 may form an "L" shape or an "I" shape. In some configurations, the heat shield conforms to a zone between (i) a first heating element 142 and (ii) a second heating element 144 and the gas panel valves 134. The heat shield 150 can include a metal (e.g., stainless steel, aluminum, titanium, etc.), such as one that is configured to reflect thermal radiation. The first portion 150a may be substantially planar and may be substantially free of holes. The second portion 150b may additionally or alternatively be substantially planar. In some configurations, the second portion 150b includes a receiving portion (e.g., a slot, a hole, a gap, etc.) that is configured to receive one or more elements of the temperature zone control system 100 therethrough (e.g., the lid valves 132). The heat shield 150 may include features that allow other elements (e.g., the first heating element 142, the second heating element 144) to have connecting features to pass therethrough. For example, supporting portions of the heating elements 142, 144 may pass through a portion of the heat shield 150. The heat shield 150 can be immobilized on (e.g., coupled to) one or more portions (e.g., a ceiling, a wall) of the reactant source cabinet 110.

Figure 2:
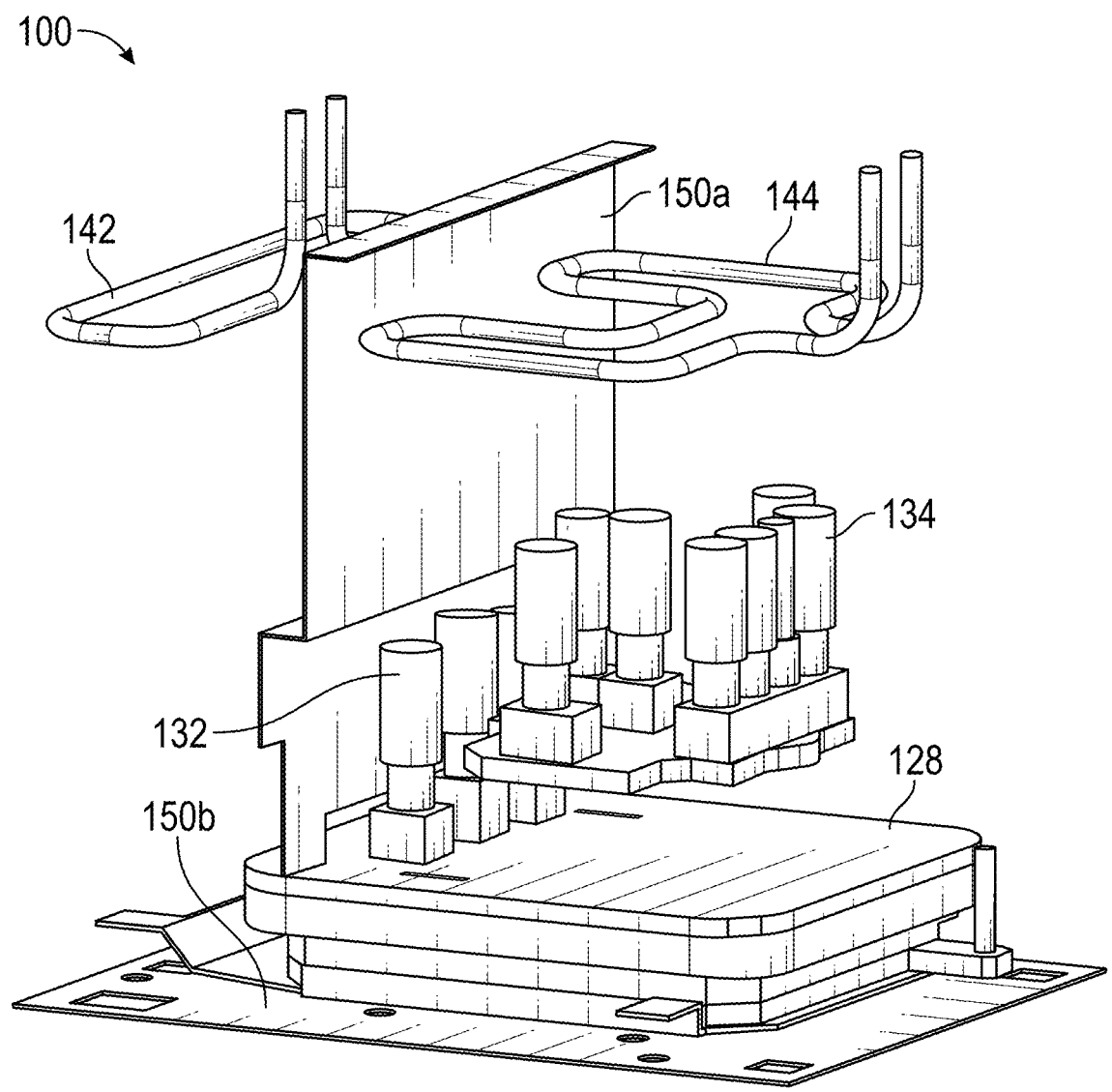
FIG. 2 shows another example of a temperature zone control system, according to some configurations.

FIG. 2 shows another example of a temperature zone control system 100, according to some configurations. As shown, the first portion 150a of the heat shield 150 can be disposed between the first heating element 142 and the second heating element 144. As shown, in some configurations, the second portion 150b can be disposed below a portion of the vessel lid 128. The second heating element 144 can be disposed such that it is configured to provide more heat (e.g., radiative heat) to the lid valves 132 than the first heating element 142 is. In some configurations, as shown in FIG. 2, the lid valves 132 and the gas panel valves 134 may be substantially disposed within the same thermal zone. The first portion 150a can be shaped to accommodate one or more of the lid valves 132.

Figure 3:
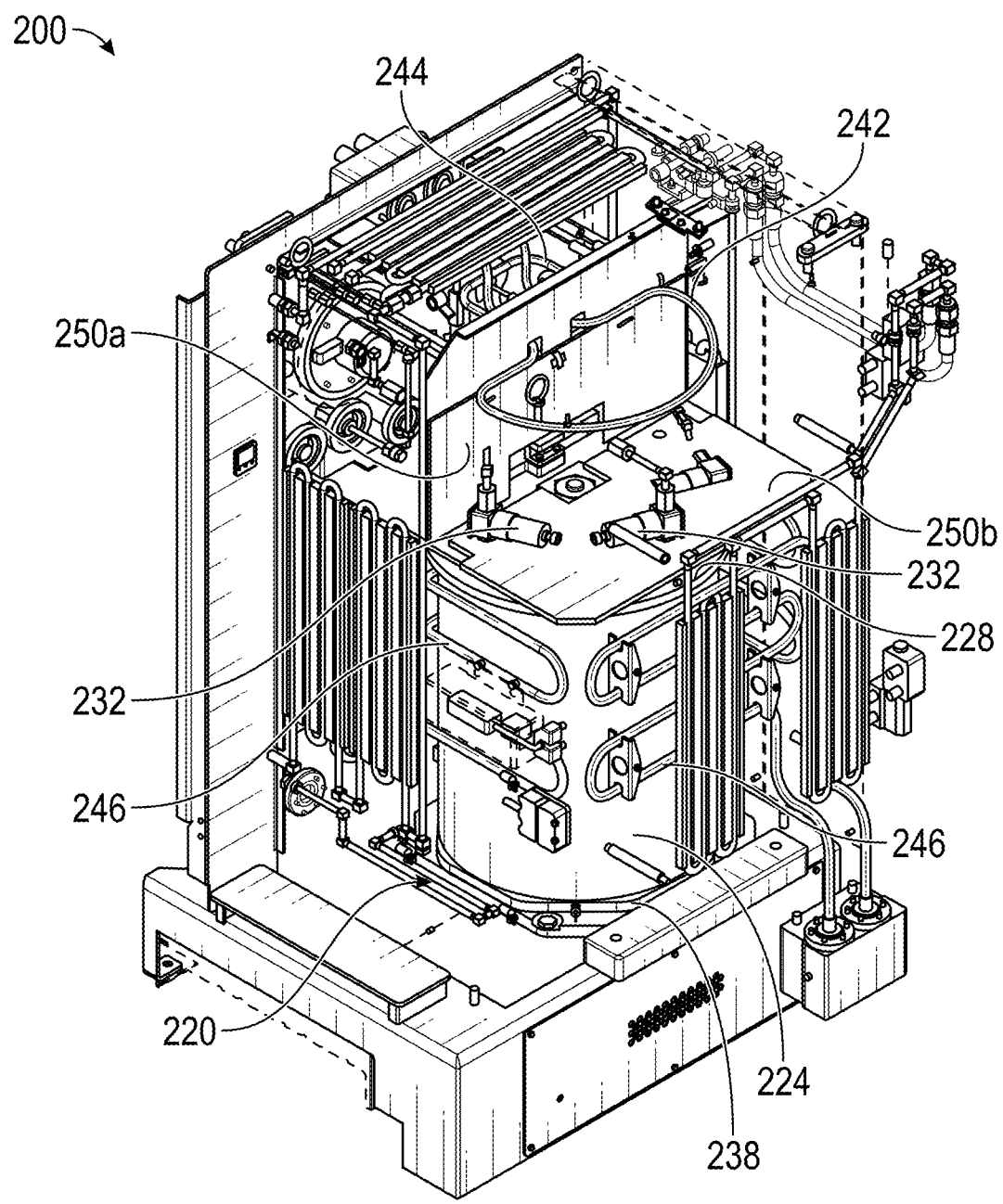
FIG. 3 shows a perspective view of a temperature zone control system, according to some configurations.

FIGS. 3-6 show various aspects of an example temperature zone control system 200, according to some embodiments. FIG. 3 shows a perspective view of the temperature zone control system 200. As shown, the temperature zone control system 200 can include a reactant source vessel 220, a heat shield 250 (e.g., having first and second portions 250a, 250b) a first heating element 242, a second heating element 244, a cooling element 238, one or more vessel base heating elements 246, and/or other elements disclosed herein. The temperature zone control system 200 may include one or more features of the temperature zone control system 100 described herein.

The reactant source vessel 220 can include a vessel base 224, a vessel lid 228, one or more lid valves 232, and/or other elements. The reactant source vessel 220 can include one or more elements and/or functionality described herein with respect to the reactant source vessel 120. The vessel base 224 may sit on the cooling element 238 as described herein. For example, the vessel base 224 may be disposed adjacent the cooling element 238. The cooling element 238 can be configured to maintain the vessel base 224 at or below the threshold temperature described herein.

The reactant source vessel 220 may include separate vessel lid 228 and sidewalls of the vessel base 224 (as shown) or they may be integral (e.g., formed from a single structure). The vessel lid 228 may have a circular or rectangular cross sectional shape, though other shapes are also suitable. The chemical reactant can be housed in the interior of the reactant source vessel 220.

The illustrated reactant source vessel 220 may be coupled (directly or indirectly) to a deposition module that is particularly suited for delivering vapor phase reactants to be used in one or more vapor phase reaction chambers. The vapor phase reactants can be used for chemical deposition (CVD) or Atomic Layer Deposition (ALD). In some embodiments, control processors and programming stored on computer-readable media are included such that the systems and methods of embodiments disclosed herein are configured to direct a reactor system to perform ALD. The reactor system can comprise the temperature zone control system. In certain embodiments, control processors and programming stored on computer-readable media are included such that the embodiments disclosed herein are configured to direct a reactor system to perform CVD. The reactor system can comprise the temperature zone control system.

The one or more heating elements disclosed herein can include a partial loop and may include a filament. The cooling element 238 can be a cooling plate. The temperature zone control system 200 can include additional elements, such as valves, inlets, outlets, heating elements, cooling elements, support structures, and/or other elements. For example, in some embodiments, the reactant source vessel 220 can be associated with one or more controllers (not shown) that can be configured to instruct a system (such as a reactor system) to perform ALD, as described in more detail herein. In some embodiments, the one or more controllers include processors and memory programmed to instruct a system (such as a reactor system) to perform ALD. The one or more controllers can be configured to control any heaters in the deposition module, pumps, valves to pumps for pressure control, robotic control for substrate handling, and/or valves for control of gas flow, including carrier gas flow to and vapor phase reactant flow from the reactant source vessel 220.

In some embodiments, the reactant source vessel 220 can include one or more heating elements as described herein. In some embodiments, one or more of the heating elements can be disposed vertically adjacent or vertically proximate the reactant source vessel 220. In some embodiments, the one or more heating elements are configured to heat the reactant source vessel 220 by conduction. In certain embodiments, a heating element comprises a heater plate that is disposed laterally spaced from the vessel lid 228. In certain embodiments, a heating element (e.g., a heater) can be disposed distally of the reactant source vessel 220. In some embodiments, one or more valves may be heated conductively and/or radiantly. The reactant source vessel 220 may be disposed in a cabinet (e.g., the reactant source cabinet 210) that is configured to be gas tight to allow pumping down to low pressures, such as between about 0.1 Torr and 20 Torr, e.g., about 5 Torr, and thus facilitate efficient radiant heating minimal conductive or convective losses to the atmosphere within the cabinet. In some configurations, the reactant source vessel 220 can be placed in higher pressures, such as 100 Torr, 200 Torr, 300 Torr, 500 Torr, or at atmospheric pressure. Other pressures are possible. In some embodiments, the solid source assembly (as disclosed herein) can operate at a target vacuum pressure. In some embodiments, the target vacuum pressure can be in the range of about 0.5 Torr-350 Torr, such as about 50 Torr. In certain embodiments, the vacuum pressure in the solid source assembly can be regulated using one or more pressure controllers.

In some embodiments, the electronics and/or computer elements for use in controlling elements of the temperature zone control system 200 (e.g., the reactant source cabinet 210, the reactant source vessel 220) can be found elsewhere in the system. For example, central controllers may control both apparatus of the one or more chambers themselves as well as control the valves that connect to the various vessels and any associated heaters. One or more valves may be used to control the flow of gas throughout reactant source vessel 220.

The one or more vessel base heating elements 246 can be disposed laterally from the vessel base 224. For example, the one or more vessel base heating elements 246 may be disposed along corresponding one or more planes that, for example, extend parallel to the vessel axis. The one or more vessel base heating elements 246 may be coiled, for example within the corresponding one or more planes. The one or more vessel base heating elements 246 may be disposed nearer a distal portion of the reactant source vessel 220 (e.g., a distal portion of the vessel base 224) than a proximal portion of the reactant source vessel 220.

Figure 4:
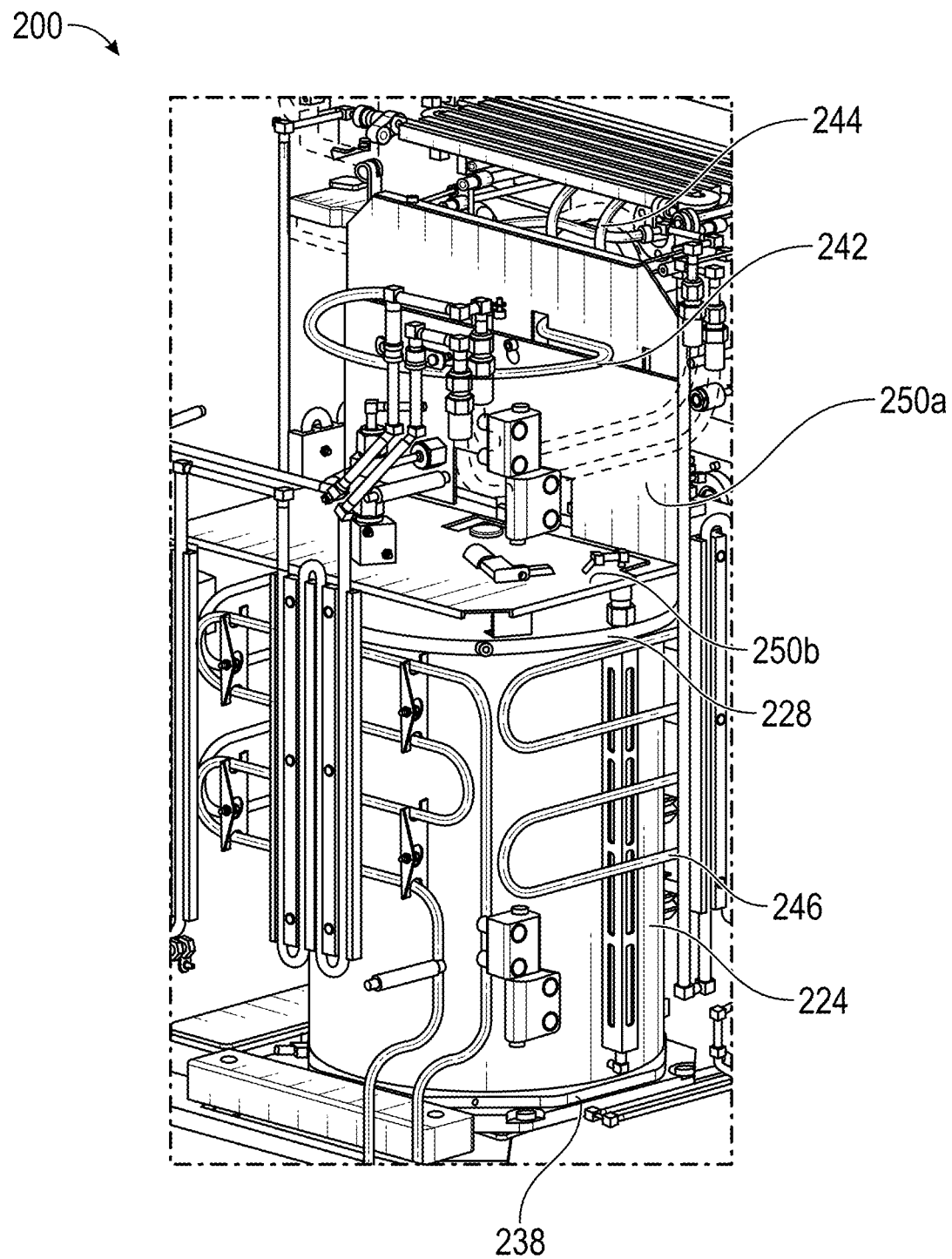
FIG. 4 shows a side perspective view of the temperature zone control system of FIG. 3.
Figure 5:
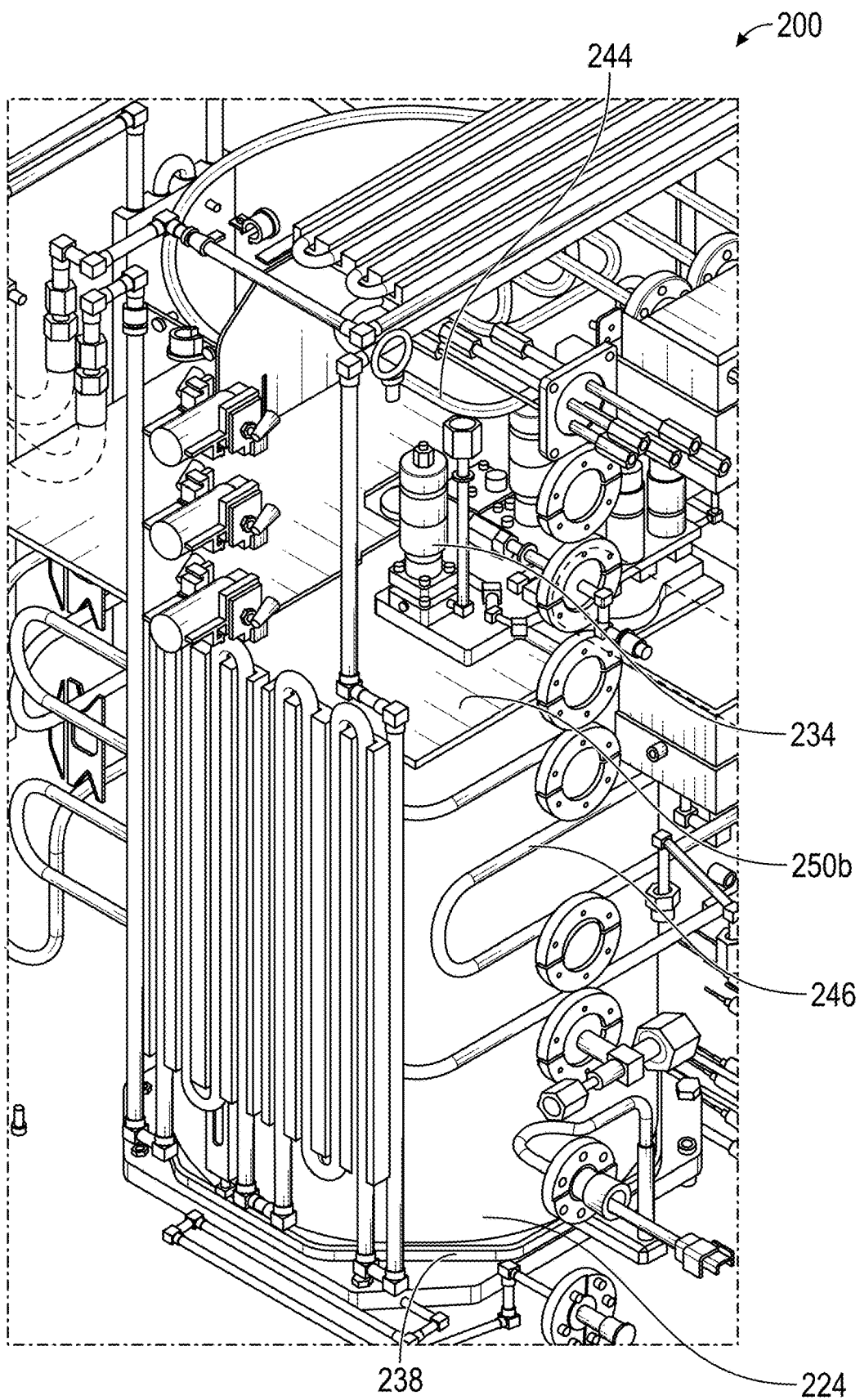
FIG. 5 shows a rear perspective view of the temperature zone control system of FIG. 3.

FIG. 4 shows a side perspective view of the temperature zone control system 200 of FIG. 3. FIG. 5 shows a rear perspective view of the temperature zone control system 200 of FIG. 3. As shown in FIG. 5, the temperature zone control system 200 can include one or more gas panel valves 234. The second heating element 244 can be configured to heat the gas panel valves 234, for example by radiative heat. The second heating element 244 may include a heating coil. Other heating elements disclosed may include a heating coil.

Figure 6:
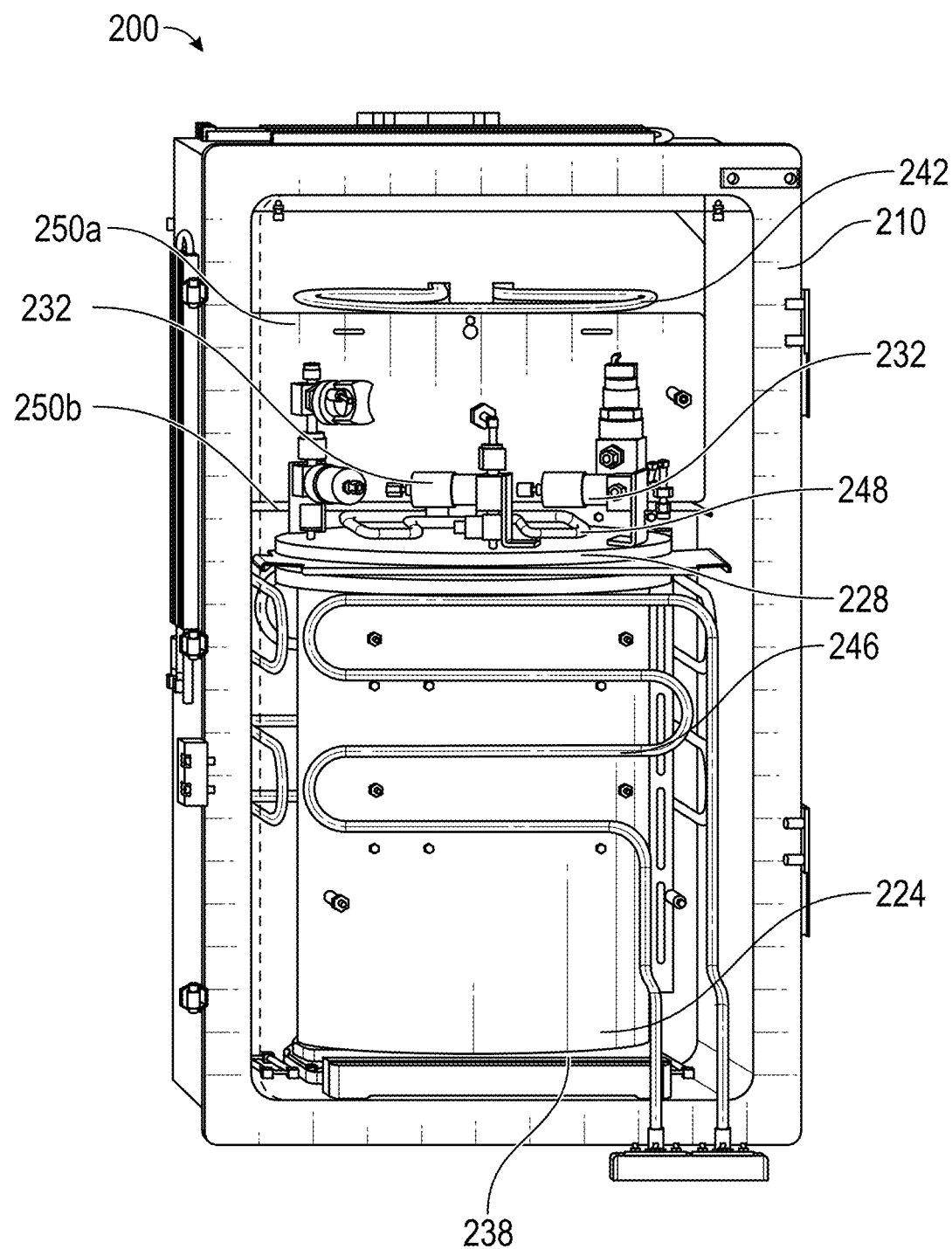
FIG. 6 shows a front perspective view of a temperature zone control system with a reactant source cabinet.

FIG. 6 shows a front perspective view of a temperature zone control system 200 with a reactant source cabinet 210. The reactant source cabinet 210 may include functionality of the reactant source cabinet 110, for example to contain a reactant source vessel comprising a vessel base 224 and vessel lid 228 in a vacuum. The temperature zone control system 200 may also include a vessel lid heating element 248. As shown, in some examples, the vessel lid heating element 248 may be configured to heat the vessel lid 228 and may be disposed between the second portion 250b and the vessel lid 228. Thus, in some embodiments, the vessel lid heating element 248 may be configured to heat the vessel lid 228 more than it heats the one or more lid valves 232. The vessel base 224 can be sized to occupy greater than 30% of the floor space inside the reactant source cabinet 210. The temperature control system may be included in a reactor system.

Figure 7:
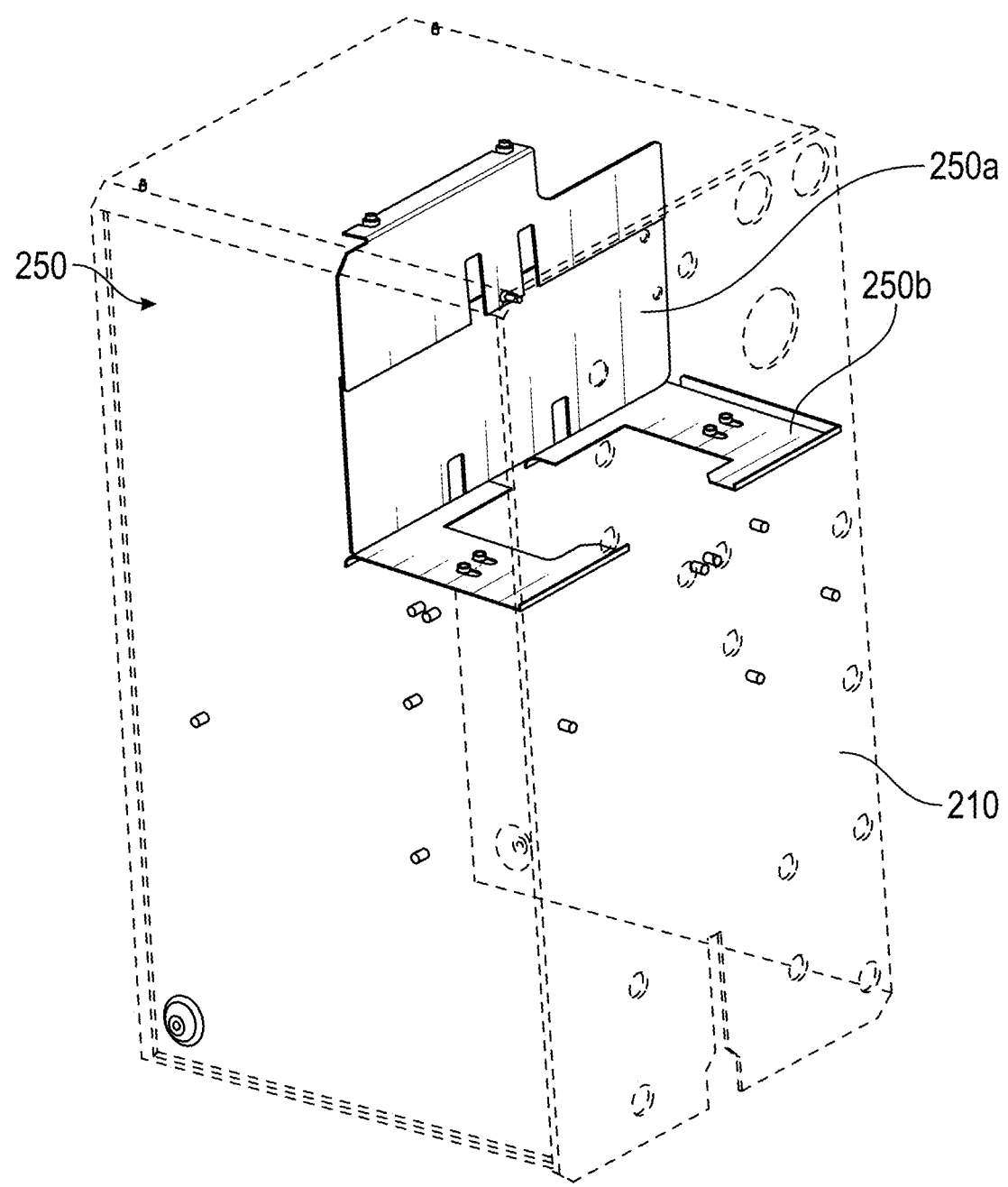
FIG. 7 shows a perspective view of the heat shield within the reactant source cabinet, according to some configurations.
Figure 8:
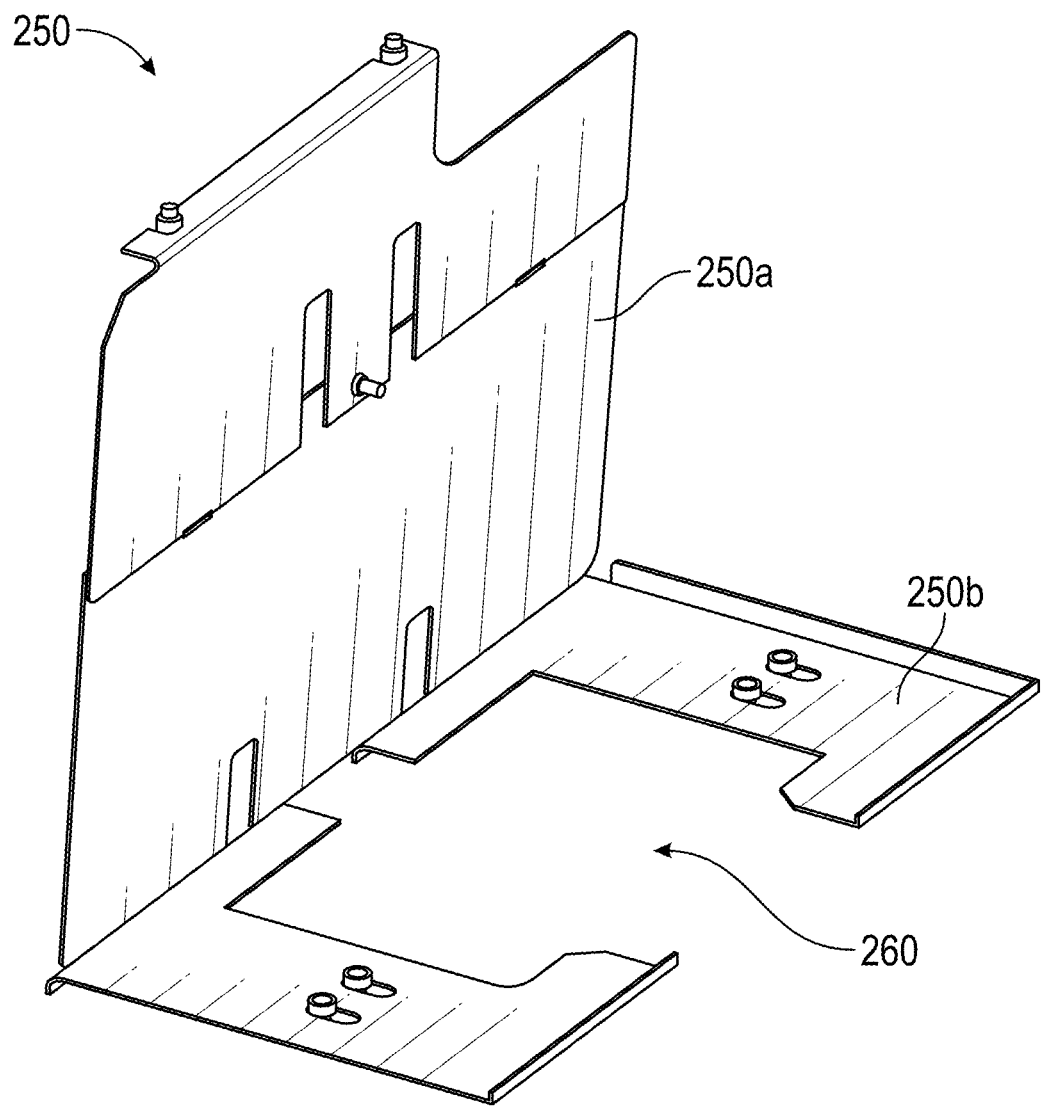
FIG. 8 shows a perspective view of the heat shield, according to some configurations.

FIGS. 7-8 show examples of a heat shield 250, according to some configurations. FIG. 7 shows a perspective view of the heat shield 250 within the reactant source cabinet 210. As shown, the heat shield 250 may be coupled (e.g., attached, fastened) to a top portion (e.g., ceiling) and/or side portion (e.g., wall) of the reactant source cabinet 210. The first portion 250a can be disposed orthogonal to the second portion 250b.

FIG. 8 shows a perspective view of the heat shield 250, according to some configurations. The heat shield 250 can include one or more receiving portions to allow one or more elements of the temperature zone control system 200 to pass therethrough. For example, the second portion 250b can include a receiving portion 260 that is configured to receive one or more lid valves 232 therethrough. The receiving portion 260 may be shaped to accommodate the lid valves 232.

Figure 9:
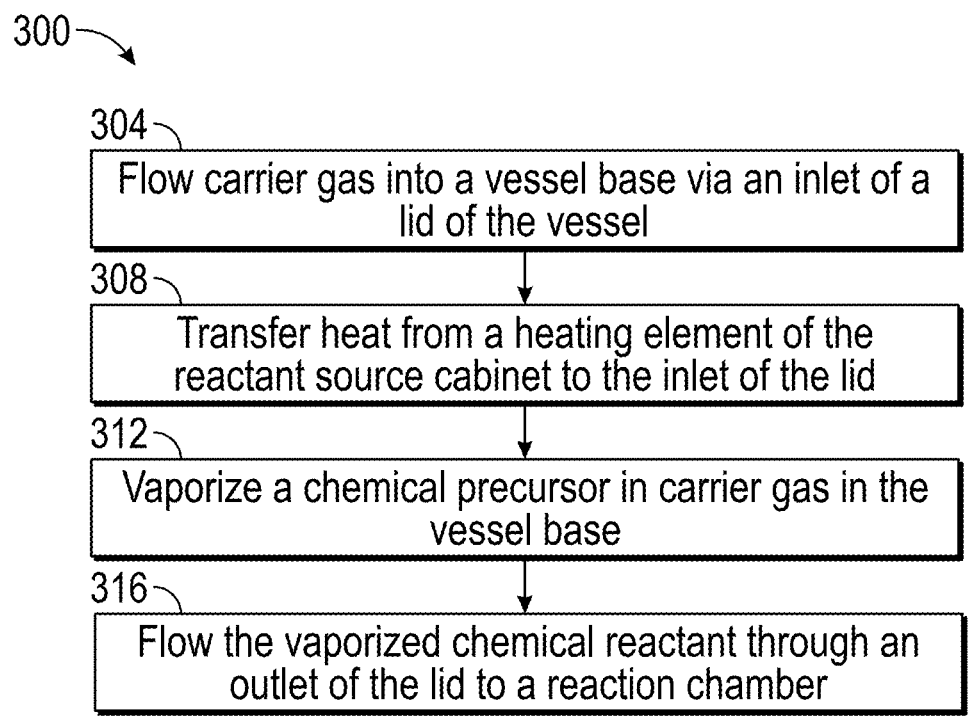
FIG. 9 shows an method of controlling heat transfer within a reactant source cabinet according to some embodiments.

FIG. 9 shows an example method 300 of controlling heat transfer within a reactant source cabinet of some embodiments. The method 300 can be performed using a temperature zone control system as described herein (e.g., the temperature zone control system 100, and/or the temperature zone control system 200). The temperature zone control system can be comprised by a reactor, such as a deposition reactor. Various elements described below may correspond to elements described herein with regard to FIGS. 1-8.

The method 300 can include continuously flowing carrier gas into a vessel base via an inlet of a lid of the vessel, at block 304. At block 308, the method 300 can further include transferring heat from a heating element of the reactant source cabinet to the inlet of the lid.

A heat shield (e.g., heat shield 150, heat shield 250) that includes a first portion that is disposed between the inlet and the vessel base may impede a transfer of heat from the heating element to the vessel base such that the inlet is maintained at a higher temperature than the vessel base. Impeding the transfer of heat from the heating element to the vessel base can include a ratio of (a) a heat transfer rate from the first heating element to the inlet to (b) a heat transfer rate from the first heating element to the vessel base (i.e., a ratio of (a) to (b)) being greater than a threshold ratio. The threshold ratio can be about 1, about 2, about 3, about 4, about 5, about 6, about 7, about 8, about 9, about 10, greater than any value therebetween, or fall within any range having endpoints therein, for example, 1-2, 1-5, 1-10, 2-5, 2-10, 3-8, or 5-10. Impeding the transfer of heat from the heating element to the vessel base can include maintaining the lid at or above a second threshold temperature without raising the vessel base above a first threshold temperature that is lower than the second threshold temperature. Various first and second threshold temperatures are disclosed herein with reference to FIGS. 1-8. For example, a ratio of the second threshold temperature to the first threshold temperature may be at least about 1, at least about 1.1, at least about 1.2, at least about 1.3, at least about 1.4, at least about 1.5, at least about 1.6, at least about 1.7, at least about 1.8, at least about 1.9, at least about 2, at least about any value therebetween, or fall within any range having endpoints therein, for example, 1-1.4, 1-1.7, 1.2-1.5, 1.3-1.7, 1.5-2, or 1.8-2. Ratios of temperature (and/or temperature values themselves) may be based in degrees Celsius (° C.) or in Kelvin (K). For example, the first and/or second threshold temperature may be about 135° C.

The method 300 can include disposing the vessel base on a cooling element. For example, the vessel base may contact the cooling element. For example, the vessel base may be disposed adjacent the cooling element. The cooling element can be configured to maintain the vessel base at or below the threshold temperature described herein. Thus, the method 300 can include maintaining at least some of the chemical reactant in a solid form within the vessel base. Additionally or alternatively, the method 300 can include maintaining the vapor phase reactant at or above the vaporizing temperature. Thus, the method 300 can include preventing undesirable condensation in the valves, filters, conduits, and other components associated with delivering the vapor phase reactants to the reaction chamber. The method 300 can additionally or alternatively include maintaining a vapor pressure at very low pressures to produce a sufficient amount of reactant vapor for the reaction process.

At block 312, the method 300 can further include vaporizing a chemical precursor in carrier gas in the vessel base, for example via sublimation or evaporation. The method 300 can further include flowing the vaporized chemical reactant through an outlet of the lid to a reaction chamber, at block 316. It is noted that carrier gas can enter the vessel via an inlet as described herein. By way of example, flow of the reactant through the inlet may be controlled by the lid valve 132 in gas communication with the inlet. By way of example, flow of the reactant through the outlet may be controlled by the lid valve 132 in gas communication with the outlet.

The temperature zone control system can include a plurality of gas panel valves that are configured to regulate flow of vapor phase reactant from the vessel to a reaction chamber. The method can further include heating the plurality of gas panel valves. A second portion of the heat shield can impede a transfer of heat from a second heating element to the inlet and/or outlet of the lid. The second portion may be disposed between (i) a first zone that includes the second heating element and plurality of gas panel valves and (ii) a second zone that includes the inlet and outlet. The first zone may correspond to the first thermal zone 160 and/or the second zone may refer to the second thermal zone 164, each discussed above with reference to FIG. 1. As such, the gas panel valves may be maintained at a higher temperature than the vessel base. Maintaining this temperature gradient may inhibit or prevent condensation of reactant in the (higher temperature) gas panel valves, while permitting source precursor to remain stably stored in the (lower temperature) vessel base.

The method 300 can further include cooling a portion of the vessel base. As used herein, "cooling" refers to the removal or withdrawal of heat, and thus can refer to maintaining the vessel base at a relatively low temperature and/or impeding the rise of the temperature of the vessel base, as well as numerically lowering the temperature of the vessel base. Cooling a portion of the vessel base can include water-cooling the portion of the vessel base. The method 300 can further include filtering particulate matter passing through the inlet, the outlet, or both. Filtering particulate matter may include preventing or impeding a passage of the reactant therethrough below a threshold temperature and to allow a passage of the reactant therethrough above the threshold temperature. The threshold temperature may be any threshold temperature described herein, such as a temperature between about 120° C. and about 160° C. The filter may include at least one of a ceramic or a metal. The method 300 can include at least partially evacuating the reactant source cabinet. Other features and/or steps of the method 300 may be drawn from the discussion of FIGS. 1-8 herein.

ILLUSTRATIVE EXAMPLES

Below are a list of nonlimiting examples of some embodiments described above.

In a 1st example, a temperature zone control system comprises: a reactant source cabinet configured to be at least partially evacuated; a vessel base configured to hold solid source chemical reactant therein, the vessel base configured to be disposed within the reactant source cabinet; a lid coupled to a distal portion of the vessel base, the lid comprising one or more lid valves; a plurality of gas panel valves configured to deliver gas from a gas source to the vessel; a first heating element configured to heat the one or more lid valves; and a heat shield, a first portion of which is disposed between the one or more lid valves and the vessel base, and a second portion of which is disposed between the first heating element and the plurality of gas panel valves, the heat shield configured to impede a transfer of heat from the lid valve to the vessel base.

In a 2nd example, the system of example 1, further comprising a cooling element in thermal communication with a proximal portion of the vessel base, and configured to preferentially cool the proximal portion of the vessel base, thereby establishing a temperature gradient from the proximal portion to the distal portion of the vessel base.

In a 3rd example, the system of example 2, wherein the cooling element comprises a water-cooled element thermally coupled to the vessel base.

In a 4th example, the system of any one of examples 1-3, wherein the first portion of the heat shield comprises a first plate, and the second portion of the heath shield comprises a second plate, the first plate disposed at an angle to the second plate.

In a 5th example, the system of example 4, wherein the first and second plates are disposed at approximately a right angle with each other.

In a 6th example, the system of any of examples 4-5, wherein the first panel is disposed between the one or more lid valves and the vessel base, and wherein the second plate is disposed approximately parallel to an axis of the vessel base.

In a 7th example, the system of any one of examples 1-6, further comprising a second heating element, the second heating element disposed such that the second plate is disposed between the one or more lid valves and the plurality of gas panel valves.

In an 8th example, the system of any of examples 1-7, wherein the heat shield is configured to impede a heat transfer to the vessel base such that a ratio of a rate of heat transfer from the first heating element to the one or more lid valves to a rate of heat transfer from the first heating element to the vessel base is greater than about 5.

In a 9th example, the system of any of examples 1-8, wherein the portion of the heat shield is configured to be disposed between the one or more lid valves and at least a portion of the lid.

In a 10th example, the system of any of examples 1-9, wherein the first heating element is configured to maintain the one or more lid valves above a first threshold temperature without raising the vessel base above a second threshold temperature that is lower than the first threshold temperature.

In a 11th example, the system of example 10, wherein the cooling element in conjunction with the first heating element maintain the one or more lid valves above a first threshold temperature without raising the vessel base above a second threshold temperature that is lower than the first threshold temperature.

In a 12th example, the system of example 10 or 11, wherein a ratio of the first threshold temperature to the second threshold temperature is at least about 1.15.

In a 13th example, the system of any of examples 10-12, wherein the first threshold temperature is less than about 135° C.

In a 14th example, the system of any of examples 10-13, wherein the second threshold temperature is greater than about 135° C.

In a 15th example, the system of any of examples 1-14, wherein each of the one or more lid valves comprises a respective inlet or outlet configured to control a flow of gas therethrough.

In a 16th example, the system of any of examples 1-15, wherein each of the one or more lid valves comprises a respective filter configured to prevent a passage of particulate matter therethrough.

In a 17th example, the system of example 16, wherein a porosity of at least one of the plurality of filters is configured to prevent a passage of the reactant therethrough below a threshold temperature and to allow a passage of the reactant therethrough above the threshold temperature.

In an 18th example, the system of example 16, wherein the threshold temperature is between about 120° C. and about 160° C.

In a 19th example, the system of any of examples 16-18, wherein the filter comprises at least one of a ceramic or a metal.

In a 20th example, the system of any of examples 1-19, wherein a ratio of a height of the vessel base to a width of the vessel base is greater than about 2.

In a 21st example, the system of any of examples 1-20, wherein a cross section of the vessel base comprises at least two flat edges.

In a 22nd example, the system of any of examples 1-21, wherein the vessel base comprises a ceramic or metal.

In a 23rd example, a method of controlling heat transfer within a reactant source cabinet comprises: continuously flowing carrier gas into a vessel base via an inlet of a lid of the vessel; transferring heat from a heating element of the reactant source cabinet to the inlet of the lid, wherein a heat shield comprising a first portion disposed between the inlet and the vessel base impedes a transfer of heat from the heating element to the vessel base such that the inlet is maintained at a higher temperature than the vessel base; vaporizing a chemical precursor in carrier gas in the vessel base; and flowing the vaporized chemical reactant through an outlet of the lid to a reaction chamber.

In a 24th example, the method of example 23, wherein the reactant source further comprises a plurality of gas panel valves configured to flow the carrier gas to the vessel, the method further comprising heating the plurality of gas panel valves, wherein a second portion of the heat shield, disposed between (i) a first zone comprising the second heating element and plurality of gas panel valves and (ii) a second zone comprising the inlet and outlet, impedes a transfer of heat from a second heating element to the inlet and outlet of the lid.

In a 25th example, the method of any of examples 23-24, further comprising cooling a portion of the vessel base.

In a 26th example, the method of example 25, wherein cooling a portion of the vessel base comprises water-cooling the portion of the vessel base.

In a 27th example, the method of any of examples 24-26, wherein impeding the transfer of heat from the heating element to the vessel base comprises a ratio of (a) a heat transfer rate from the first heating element to the inlet to (b) a heat transfer rate from the first heating element to the vessel base of greater than about 4.

In a 28th example, the method of any of examples 24-27, wherein impeding the transfer of heat from the heating element to the vessel base comprises maintaining the lid above a first threshold temperature without raising the vessel base above a second threshold temperature that is lower than the first threshold temperature.

In a 29th example, the method of example 28, wherein a ratio of the first threshold temperature to the second threshold temperature is at least about 1.15.

In a 30th example, the method of any of examples 28-29, wherein the first threshold temperature is less than about 135° C.

In a 31st example, the method of any of examples 28-30, wherein the second threshold temperature is greater than about 135° C.

In a 32nd example, the method of any of examples 23-31, further comprising filtering particulate matter passing through the inlet, the outlet, or both.

In a 33rd example, the method of example 32, wherein filtering particulate matter comprises prevent a passage of the reactant therethrough below a threshold temperature and to allow a passage of the reactant therethrough above the threshold temperature.

In a 34th example, the method of example 32, wherein the threshold temperature is between about 120° C. and about 160° C.

In a 35th example, the method of any of examples 32-33, wherein the filter comprises at least one of a ceramic or a metal.

In a 36th example, the method of any of examples 23-35, further comprising at least partially evacuating the reactant source cabinet.

OTHER CONSIDERATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described herein may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described herein as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described herein should not be understood as requiring such separation in all embodiments, and it should be understood that the described components and systems may generally be integrated together in a single product or packaged into multiple products (for example, a filter insert and a source vessel comprising a housing and base). Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the features disclosed herein. For example, although many examples within this disclosure are provided with respect to supplying vapor from solid sources for feeding deposition chambers for semiconductor fabrication, certain embodiments described herein may be implemented for a wide variety of other applications and/or in numerous other contexts.

What is claimed is:

1. A temperature zone control system comprising:
    a reactant source cabinet configured to be at least partially evacuated;
    a vessel base configured to hold solid source chemical reactant therein, the vessel base configured to be disposed within the reactant source cabinet;
    a lid coupled to a distal portion of the vessel base, the lid comprising one or more lid valves;
    a plurality of gas panel valves configured to deliver gas from a gas source to the vessel;
    a first heating element configured to heat the one or more lid valves; and
    a heat shield, a first portion of which is disposed between the one or more lid valves and the vessel base, and a second portion of which is disposed between the first heating element and the plurality of gas panel valves, the heat shield configured to impede a transfer of heat from the lid valve to the vessel base.

2. The system of claim 1, further comprising a cooling element in thermal communication with a proximal portion of the vessel base, and configured to preferentially cool the proximal portion of the vessel base, thereby establishing a temperature gradient from the proximal portion to the distal portion of the vessel base.

3. The system of claim 2, wherein the cooling element in conjunction with the first heating element maintains the one or more lid valves above a first threshold temperature without raising the vessel base above a second threshold temperature that is lower than the first threshold temperature.

4. The system of claim 1, wherein the first portion of the heat shield comprises a first plate, and the second portion of the heath shield comprises a second plate, the first plate disposed at an angle to the second plate.

5. The system of claim 4, wherein the first plate is disposed between the one or more lid valves and the vessel base, and wherein the second plate is disposed approximately parallel to an axis of the vessel base.

6. The system of claim 5, further comprising a second heating element, the second heating element disposed such that the second plate is disposed between the one or more lid valves and the plurality of gas panel valves.

7. The system of claim 1, wherein the heat shield is configured to impede a heat transfer to the vessel base such that a ratio of a rate of heat transfer from the first heating element to the one or more lid valves to a rate of heat transfer from the first heating element to the vessel base is greater than about 5.

8. The system of claim 1, wherein the first portion of the heat shield is configured to be disposed between the one or more lid valves and at least a portion of the lid.

9. The system of claim 1, wherein the first heating element is configured to maintain the one or more lid valves above a first threshold temperature without raising the vessel base above a second threshold temperature that is lower than the first threshold temperature.

10. The system of claim 1, wherein each of the one or more lid valves comprises a respective filter configured to prevent a passage of particulate matter therethrough.

11. The system of claim 10, wherein a porosity of at least one of the plurality of filters is configured to prevent a passage of the reactant therethrough below a threshold temperature and to allow a passage of the reactant therethrough above the threshold temperature.

* * * * *